Figure 1:
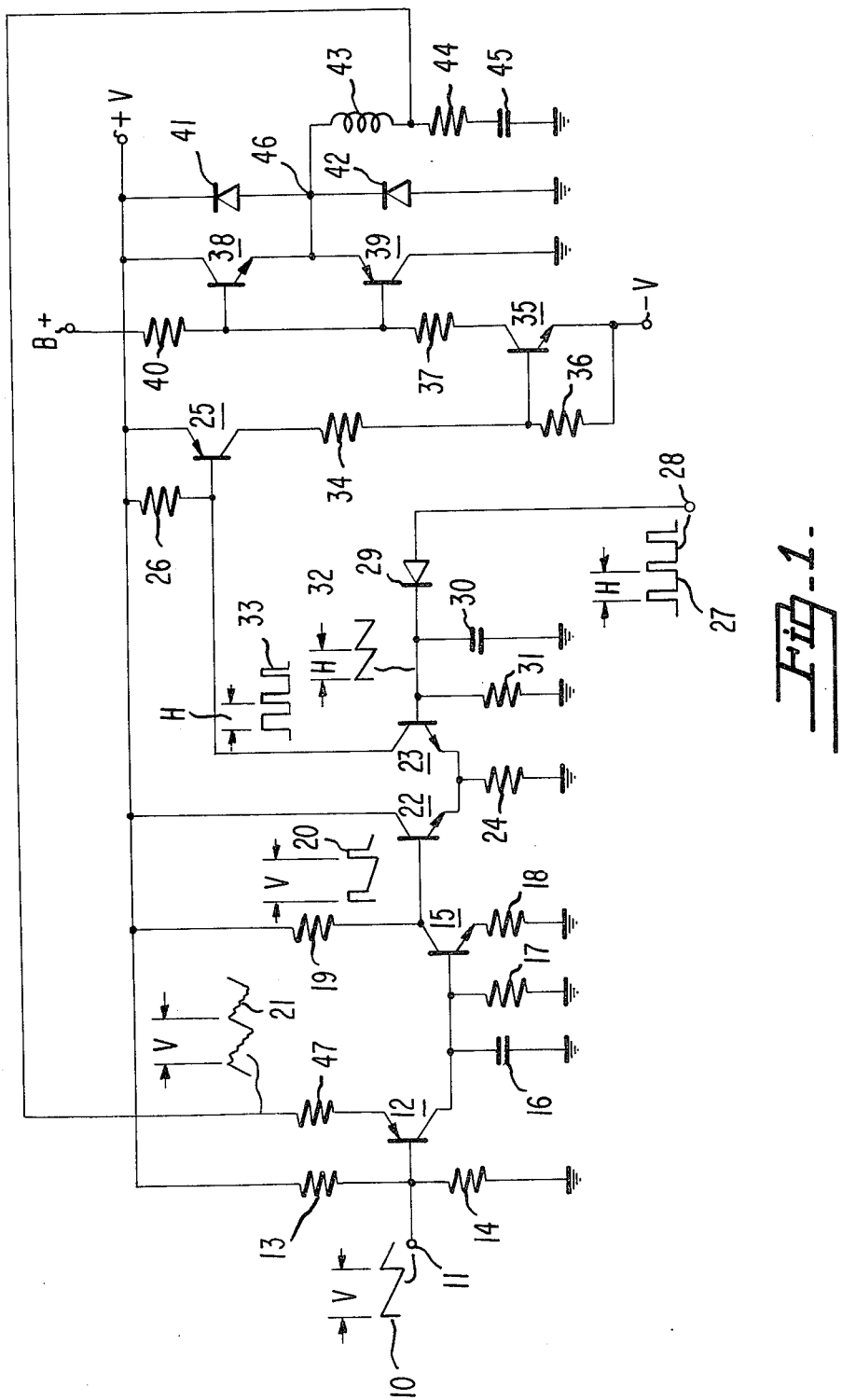

United States Patent
Peer

[11] 3,939,380
[45] Feb. 17, 1976

[54] CLASS D AMPLIFIER

[75] Inventor: John Charles Peer, Indianapolis, Ind.

[73] Assignee: RCA Corporation, New York, N.Y.

[22] Filed: Feb. 21, 1974

[21] Appl. No.: 444,405

[52] U.S. Cl. ............... 315/397; 315/407; 315/387; 330/13; 330/17; 330/207 A
[51] Int. Cl.² ................ H01J 29/70; H01J 29/76
[58] Field of Search .......... 315/396, 397, 407, 387; 330/13, 17, 207 A

[56] References Cited
UNITED STATES PATENTS

| | | | |
|---|---|---|---|
| 3,015,781 | 1/1962 | Eklov | 330/207 A |
| 3,336,538 | 8/1967 | Crowhurst | 330/207 A |
| 3,548,329 | 12/1970 | Camenzind | 330/207 A |
| 3,636,380 | 1/1972 | Anderson | 330/13 |
| 3,781,589 | 12/1973 | Brockmann | 315/397 |

Primary Examiner—T. H. Tubbesing
Assistant Examiner—T. M. Blum
Attorney, Agent, or Firm—Eugene M. Whitacre; Paul J. Rasmussen

[57] ABSTRACT

A class D amplifier, suitable for use as a vertical deflection amplifier in a television receiver, includes two transistors coupled to function in a push-pull manner. Two diodes are serially coupled with each other in parallel with the output transistors and are poled to conduct forward current in a direction opposite to the forward current of the two transistors. A junction of the two transistors is coupled to a junction of the two diodes and forms an output terminal to which a deflection winding is coupled. A series of pulses at a first frequency, such as the horizontal deflection frequency or a multiple thereof, are pulse width modulated in accordance with the amplitude of a sawtooth waveform at a second frequency, such as the vertical deflection frequency, in a pulse width modulation stage and are coupled to the input terminals of the two transistors. The two transistors are alternately enabled for conduction by the pulse width modulated signals. During the first half of the vertical scan interval when average deflection current is flowing in a first direction through the deflection winding, the first transistor conducts current in the forward direction and the second transistor and its associated diode conduct current in their reverse and forward directions, respectively. During the second half of vertical scan with the average deflection current flowing in the opposite direction, the second transistor conducts current in its forward direction and the first transistor and its associated diode conduct current in their reverse and forward directions, respectively, for minimizing crossover distortion at the middle of the vertical scan interval.

7 Claims, 8 Drawing Figures

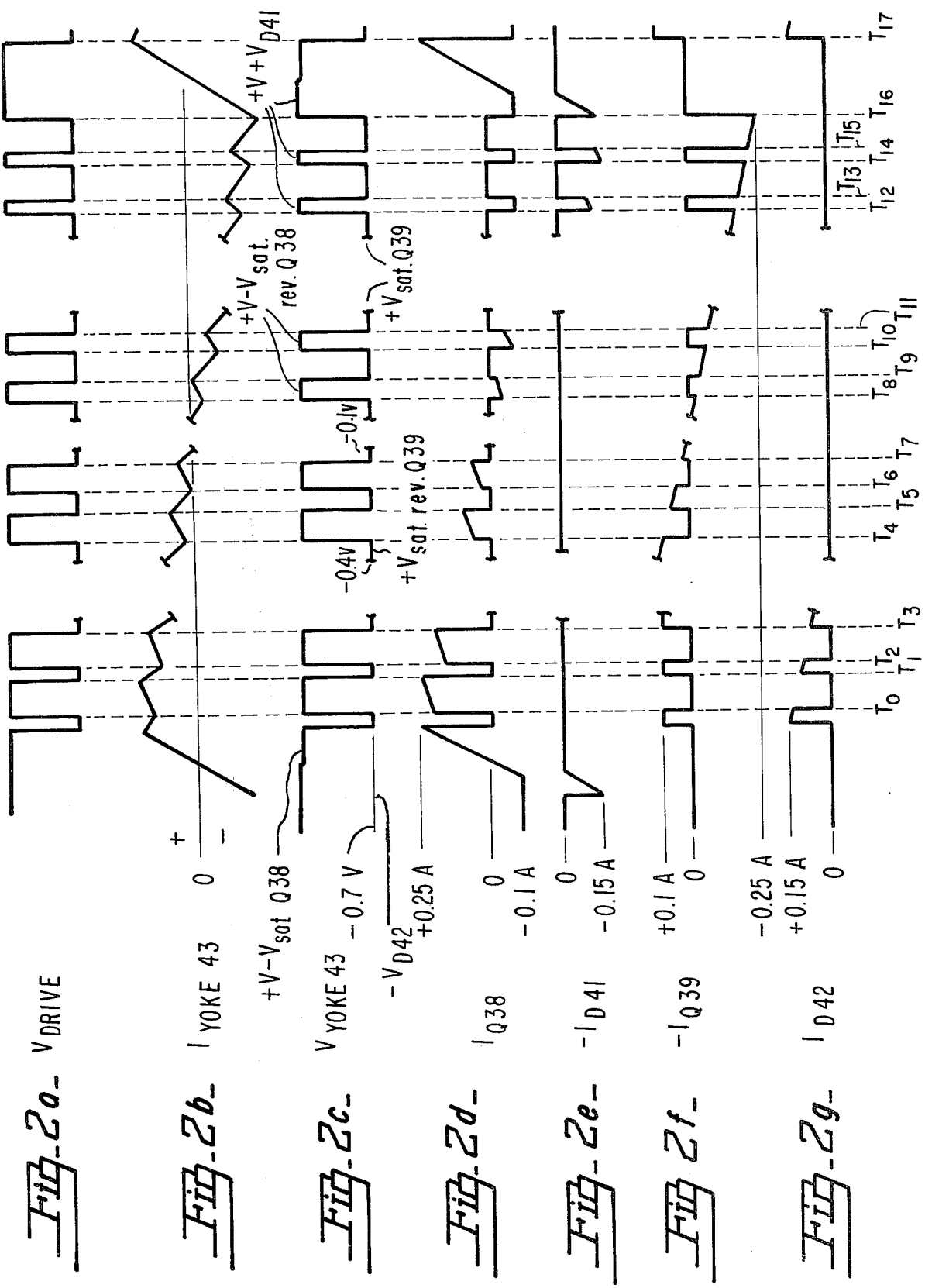

CLASS D AMPLIFIER

BACKGROUND OF THE INVENTION

This invention relates to class D amplifiers.

The use of semiconductors such as transistors in deflection current amplifiers in television receivers has resulted in cost saving and increased operating efficiency. In vertical deflection amplifiers relatively high efficiency class B output stages have been utilized to reduce the power dissipation across the transistors.

Even more efficiency can be achieved by utilizing a class D output stage in which the two output transistors are alternately turned on and off and function as switches. With such an arrangement the power dissipated in the output stages is primarily saturation and switching loss since the transistors are either cutoff or in saturation. The desired scanning current required by the vertical deflection coils coupled to an output terminal at the junction of the two transistors is essentially a sawtooth waveform. In order to operate the vertical deflection amplifier in a class D mode, a sawtooth waveform at the vertical deflection rate may be utilized to pulse width modulate a train of waveforms at the horizontal deflection rate. The modulated horizontal rate waveforms then serve as the switching control waveforms for the class D output stage. U.S. Pat. No. 3,456,150 discloses an arrangement for performing this type modulation which results in an average sawtooth current at the vertical deflection rate to be driven through the vertical deflection coils.

Since deflection yoke current must flow in the same direction in the yoke during both portions of each horizontal rate cycle to maintain the average desired net yoke current, the arrangement in that patent provides a filter circuit for the horizontal rate components including energy storage means which must be supplied during only one portion of each horizontal cycle. Therefore, the peak current conducted by the output stage is about twice the peak yoke current requirement. Additionally, the filter circuit required to remove the horizontal rate component from the deflection yoke and to maintain the desired yoke current flow in the same direction itself dissipates substantial power. Therefore, the combined peak current of the storage circuit, filter network and yoke greatly exceed the peak yoke current, thus requiring higher current capability in the output stage transistors and also undesirably increasing the total power consumed by the deflection circuit. Because this circuit operates class D, the output transistors dissipate less power than their counterparts in a class B output stage, but the overall power requirements of the total circuit may exceed those of a class B circuit.

In accordance with the invention, a class D amplifier is provided including a current amplifying stage comprising first and second serially coupled active current conducting devices. First and second unidirectional conducting devices are respectively coupled in parallel with the first and second active devices and are poled to conduct forward current in opposite directions than the active devices. A junction of the first and second active devices and unidirectional conducting devices forms an output terminal adapted for supplying current to a load. Means are coupled to the control electrodes of the active devices for providing a signal for alternately enabling the first and second active devices for conduction such that during an amplifying cycle the first active device conducts in the forward direction and the second active device conducts in the reverse direction, then the second active device conducts in the forward direction and the first active device conducts in the reverse direction for minimizing crossover distortion in the amplifier.

A more detailed description of the invention is given in the following description and accompanying drawings of which:

FIG. 1 is a circuit diagram of a deflection circuit embodying the invention; and FIGS. 2a-2g illustrate normalized waveforms obtained in the circuit of FIG. 1.

DESCRIPTION OF THE INVENTION

FIG. 1 is a diagram of a deflection circuit embodying a class D amplifier in accordance with the invention. A suitable vertical deflection rate sawtooth generator, not shown, provides a series of vertical deflection rate sawtooth waveforms 10 AC coupled to a terminal 11 of the deflection circuit. These waveforms are coupled to the base of an error amplifier transistor 12. The junction of serially coupled resistors 13 and 14 coupled between a source of positive voltage +V and ground provides a DC bias potential for the base of transistor 12. The collector of transistor 12 is coupled to the base of an amplifying transistor 15. A parallel combination of an integrating capacitor 16 and a resistor 17 is coupled between the collector of transistor 12 and ground. The emitter of transistor 12 is coupled through a resistor 47 to the junction of vertical deflection winding 43 and a current sampling feedback resistor 44. The emitter of transistor 15 is coupled through a resistor 18 to ground and the collector of transistor 15 is coupled through a load resistor 19 to the +V voltage source.

The collector electrode of transistor 15 is coupled to the base electrode of a transistor 22 which, in conjunction with transistor 23, serves as a pulse width modulator. The collector of transistor 22 is returned to the +V source. The emitters of both of transistors 22 and 23 are coupled through a common resistor 24 to ground. A series of horizontal deflection rate pulses 27 obtained from a suitable source such as a winding of the television receiver horizontal output transformer, not shown, is coupled through a terminal 28 to the anode of a diode 29. The cathode of diode 29 is coupled to the base of transistor 23 and through an integrating network comprising the parallel combination of a resistor 31 and a capacitor 30 coupled to ground.

The collector electrode of transistor 23 is coupled to the base of an amplifying transistor 25. The base of transistor 25 is coupled through a resistor 26 to the +V source, to which is also coupled the emitter electrode. The collector of transistor 25 is coupled through a resistor 34 to the base of a second amplifying driver transistor 35. The base of transistor 35 is coupled through a biasing resistor 36 to the emitter of transistor 35 and to a source of negative voltage −V. The collector of transistor 35 is coupled through resistors 37 and 40 to a source of positive potential B+. In this embodiment, B+ may be in the order of +100 volts and the +V source may be in the order of +40 volts. The −V source may be just several volts negative, the requirement being that it supply approximately −0.7V to the base of transistor 39 as described subsequently. The junction of resistors 37 and 40 is coupled to the base electrodes of transistors 38 and 39.

Transistors 38 and 39, which are capable of bidirectional conduction, have their main current conduction path serially coupled between the +V source and ground and are connected in circuit in a push-pull configuration. The junction of the emitters of output current amplifying transistors 38 and 39 forms an output terminal 46 which is coupled to a terminal of a vertical deflection winding 43. The other end of winding 43 is coupled through current sampling feedback resistor 44 and a DC blocking capacitor 45 to ground. Two serially coupled diodes 41 and 42 are coupled between the +V voltage source and ground and have their junction coupled to output terminal 46. Diodes 41 and 42 are poled to conduct forward current in a direction opposite to the forward current conduction path of transistors 38 and 39 to which they are connected in parallel, respectively.

During operation, the sawtooth vertical deflection rate waveforms 10 coupled to the base of transistor 12 are of the desired shape for producing the desired sawtooth scanning current through deflection winding 43. The DC potential established by resistors 13 and 14 at the base of transistor 12 determines the DC operating potential at the deflection winding 43 by virtue of the direct current coupling between these two points through the amplifier.

The horizontal deflection rate pulses 27, the positive portions of which are passed by diode 29, are integrated by capacitor 30 to have the essentially sawtooth shape illustrated by the waveforms 32 at the base of transistor 23. It is the discharge of capacitor 30 through resistor 31 which forms the sawtooth slope of the waveforms. At the same time that these sawtooth waveforms 32 are coupled to the base of transistor 23, an error correction voltage 20, obtained by comparing waveform 10 with feedback waveform 21 in transistor stage 12 and amplified by transistor 15, is coupled to the base of transistor 22. Due to the differential action of transistors 22 and 23, the higher the positive potential at the base of transistor 22, the shorter will be the conduction time of transistor 23 during each horizontal waveform interval. Thus, as illustrated by the pulse width modulated horizontal rate waveform train 33 obtained at the collector of transistor 23, the first pulse in the waveform train 33 has a higher duty cycle of transistor 23 "off" time compared to its "on" time relative to the duty cycle of the last pulse of waveform train 33. This is because the higher positive level of the beginning portion of the sawtooth slope of vertical deflection rate waveform 20 keeps transistor 23 cut off longer than during the less positive level portion of waveform 20. The result is that waveforms of pulse train 33 comprise a series of horizontal rate pulses which are pulse width modulated in accordance with the amplitude of the vertical deflection rate sawtooth waveform. Waveform train 33 is periodic at the vertical deflection rate.

The pulse width modulated waveforms 33 are amplified by a first driver transistor 25 and are further amplified by the second driver transistor amplifier 35 and are then coupled to the commonly connected bases of output current amplifying transistors 38 and 39.

In the remaining discussion of the operation of the class D deflection amplifier of FIG. 1, reference will also be made to the waveforms contained in FIGS. 2a-2g which illustrate normalized waveforms obtained at various points in the circuit of FIG. 1.

FIG. 2a illustrates the voltage waveform of the pulse width modulated drive signals coupled to the base electrodes of transistors 38 and 39. Because of the push-pull configuration of the opposite conductivity transistors 38 and 39, the waveform of FIG. 2a alternately enables transistors 38 and 39 to conduct, transistor 38 being enabled during the positive portion of the waveform and transistor 39 being enabled during the negative portion of the waveforms. During the first half of the trace interval of the vertical deflection waveforms, as indicated by the time $T_0$ - $T_7$ of FIGS. 2a-2g, the pulse width modulation of the waveform of FIG. 2a is such that there is more positive average voltage drive coupled to the bases of transistors 38 and 39 than there is negative voltage drive. Positive and negative is with respect to the relatively constant voltage across capacitor 45. This results in an average positive scanning current flowing from the +V supply through transistor 38 through deflection winding 43, resistor 44 and capacitor 45 to ground.

Particularly, during the interval $T_0$ - $T_1$, transistor 38 is in saturation and positive current is flowing as described. Transistor 39 is cut off. The voltage at the junction of diodes 41 and 42 is at +V minus the saturation voltage drop across transistor 38. This results in diodes 41 and 42 being reverse biased and nonconducting during this time. At $T_1$ the voltage drive waveform starts to decrease rapidly, trying to cut off transistor 38. The yoke current must continue flowing in transistor 38 until an alternate current path is found. Therefore, the yoke voltage also decreases to keep transistor 38 conducting. When the yoke voltage goes 0.7 volts below ground, diode 42 conducts, clamping the yoke voltage to a maximum negative potential of −0.7 volts. Transistor 38 is then allowed to cut off since an alternate current path was found. As the base voltage applied to transistor 39 goes more negative than −0.7 volts, its collector-base junction becomes forward biased and transistor 39 is enabled for conduction in the reverse direction. Now the yoke current flows from ground through collector to emitter of transistor 39 to the deflection winding 43. Diode 41 is reverse biased and nonconducting during the reverse conduction time of transistor 39.

It is noted that diode 42 becomes forward biased and conducts before transistor 39 conducts in the reverse direction. This is because the voltage drive waveform must drop an amount equal to the base-emitter drop of transistor 38 and the forward biasing voltage for the collector-base junction of transistor 39, or a total of about 1.4 volts, before transistor 39 conducts in the reverse direction.

When the voltage drive waveform of FIG. 2a changes in a positive direction, such as at $T_2$, transistor 39 is first cutoff from its reverse conduction and diode 42 conducts yoke current until the voltage drive waveform rises to +0.7 volts and higher to forward bias transistor 38 for its forward conduction occurring during the intervals $T_0$ - $T_1$, $T_2$ - $T_3$, etc.

As can be seen in FIG. 2g, diode 42 conducts for its full conducting interval when the yoke current is large enough so that the reverse conduction of transistor 39 cannot supply all of the yoke current. This is illustrated in the interval $T_0$ - $T_3$. Thus, driving the negative half cycles occurring in the interval $T_0$ - $T_3$, the deflection yoke current is shared by the reverse conduction of transistor 39 and forward conduction of diode 42, with the negative voltage at output terminal 46, FIG. 2c, clamped at −0.7 volts.

However, this is not the case during the yoke current crossover interval occurring between $T_4$ - $T_7$. During this interval the yoke current is linearly approaching zero and the reverse conduction of transistor 39 can support the full yoke current with little reverse conduction voltage drop as the voltage drop is proportional to yoke current. During this interval, there is not enough yoke current through transistor 39 to forward bias diode 42, so conduction is not maintained in diode 42 and the yoke voltage decreases to $-0.1$ V. The advantage of this is that there is a substantially smooth transition in yoke voltage at the cross-over point which results in a substantially linear vertical scan near the center of the raster, eliminating crossover distortion. As noted above, the base drive voltage must drop to $-0.7$ V before the collector-base junction of transistor 39 becomes forward biased, allowing it to conduct. As the yoke voltage forward biases diode 42 before this occurs, diode 42 conducts before transistor 39, even during the $T_4$ - $T_7$ interval. However, as the voltage drive waveform of FIG. 2a changes quite rapidly, the conduction of diode 42 during the $T_4$ - $T_7$ interval lasts for only about a microsecond. The resulting transient on the switched yoke voltage, $-0.7$ V for one microsecond, is not enough to have any noticeable effect on yoke current and thus does not create a crossover distortion problem.

During the interval $T_1$ - $T_2$, deflection yoke current is positive but decreasing slightly as indicated by the waveform in FIG. 2b because there is a negative voltage across the yoke. However, the current decreases just slightly because the time constant of the yoke is large relative to the $T_1$ - $T_2$ interval.

FIG. 2b illustrates the scanning current waveform through deflection winding 43. The amplitude of the current perturbations at the top of the scanning current is greatly exaggerated to indicate the conduction conditions during each horizontal cycle as described above. FIG. 2d illustrates the conduction current of transistor 38. It should be noted that during the first half of the vertical trace interval $T_0$ - $T_7$, transistor 38 conducts a switched decreasing positive current. FIG. 2e illustrates the conduction current of diode 41. For illustrative purposes, the current illustrated is the negative of the actual current through diode 41. It should be noted that during the first half of the vertical trace interval, diode 41 is not conducting. FIG. 2f illustrates the conduction current of transistor 39. For illustrative purposes, the negative of this current is shown in FIG. 2f. As described above, it can be seen in FIG. 2f that during the first half of the vertical trace interval transistor 39 conducts current in the reverse direction. With regard to the yoke current crossover interval occurring between $T_7$ - $T_8$, by referring to FIG. 2c it can be seen that the yoke voltage is $-0.1$ volt at time $T_7$ and approximately $+0.1$ volt at time $T_8$. The voltage at $T_8$, when transistor 39 is conducting in the forward direction, is slightly positive with respect to ground as determined by forward saturation voltage drop across transistor 39. Without the provision of the reverse conduction of the transistor 39, the voltage step at the deflection yoke current crossover point would be the voltage drop across diode 42 plus the forward saturation voltage of transistor 39. This substantial step in voltage at the crossover point would undesirably be seen at the center of the picture tube viewing screen as a relatively large concentration of the horizontal scanning lines as the beam slows down at the crossover point.

During the first half of the vertical trace interval, transistor 38 conducts positive current in its forward direction as illustrated by FIG. 2d in the time periods $T_0$ - $T_1$, $T_2$ - $T_3$, etc. The positive deflection yoke current during the first half of the vertical trace interval is conducted in the reverse direction by transistor 39 and in the forward direction by diode 42, as illustrated by waveforms in FIGS. 2f and 2g, respectively, during the time intervals $T_1$ - $T_2$, $T_5$ - $T_6$, etc.

Thus, the function of the current amplifier including transistors 38 and 39 and diodes 41 and 42 is to switch the deflection winding 43 voltage at the horizontal deflection rate pulse width modulated at a vertical deflection rate to generate the required vertical rate sawtooth deflection winding current.

The switching of the deflection yoke voltage at the relatively high horizontal deflection rate is accomplished with minimum perturbation of the desired sawtooth vertical deflection current by taking advantage of the fact that the impedance of typical toroidal vertical deflection windings is on the order of 12–80 millihenrys and 4–30 ohms, yielding a L-R ratio of approximately $2-3\times10^{-3}$ seconds at the 60Hz vertical scanning rate. The impedance of the deflection winding is largely resistive at the vertical rate but at the much higher horizontal deflection rate the impedance is determined primarily by the inductance and the impedance is much higher, therefore the impedance of deflection winding 43 resists a change in current flow caused by the applied horizontal rate voltage switching waveform of FIG. 2c. The current through deflection winding 43 then will be governed by the average voltage applied across the yoke. The yoke inductance therefore effectively integrates out the high frequency horizontal switching current component so that the average current in winding 43 is the desired sawtooth-shaped vertical deflection rate current.

During the first half of vertical scan, $T_0$ - $T_7$, transistor 38 serves to connect the yoke to the voltage source +V. Transistor 39 and diode 42 serve to provide a low impedance path for yoke current during the times transistor 38 is not conducting.

During the second half of the vertical trace interval illustrated by the time period $T_8$ - $T_{16}$ in FIGS. 2a-2g, the conduction roles of transistors 38 and 39, diodes 41 and 42, respectively, are reversed. It can be seen that transistor 38 conducts current in the reverse direction and the difference between total deflection yoke current and the reverse current of transistor 38 is conducted in the forward direction by diode 41 when the drive voltage is positive. This condition is illustrated in the time intervals $T_{10}$ - $T_{11}$ and $T_{12}$ - $T_{13}$, etc.

During the second half of the vertical trace interval, transistor 39 actively controls the yoke current by conducting in its forward direction as illustrated by the waveform of FIG. 2f during the time interval $T_9$ - $T_{10}$ and $T_{13}$ - $T_{14}$, etc. Transistor 38 and diode 41 now provide a current path to recover the yoke current when transistor 39 is not conducting. Diode 42 does not conduct during the second half of the vertical trace interval. It should be noted that during the second half of the vertical trace interval as illustrated in FIG. 2b, the deflection current has crossed the crossover point, $T_7$ - $T_8$, and is now flowing in a negative direction or opposite the direction it flowed during the first half of the vertical trace interval. During the second half of vertical scan, the negative yoke current is sourced during the interval $T_{13}$ - $T_{14}$ in a manner similar to the positive yoke current sourcing in the interval $T_0 - T_1$. The alternate yoke current path is provided during the interval $T_{14} - T_{15}$ similar to the alternate current flow during the interval $T_1 - T_2$.

During retrace, which period is illustrated by the time interval $T_{16} - T_{17}$ in FIGS. 2a-2g, the voltage drive waveform of FIG. 2a is at a positive level. This results in transistor 38 being saturated and puts the +V voltage minus the reverse saturation voltage of transistor 38 or pulse the forward drop of diode 41 whichever has the lesser magnitude at output terminal 46 for the first retrace portion when the yoke current is negative. During the last portion of retrace, when the yoke current has reversed and is positive, the voltage at output terminal 46 is +V minus the forward saturation voltage of transistor 38. The +V voltage is selected high enough to cause the deflection winding current of FIG. 2b to reverse itself during the required retrace interval. It can be seen by referring to FIGS. 2d and 2e that the deflection winding current during the retrace interval is first conducted by the combination of forward conducting diode 41 and the reverse conduction of transistor 38 during the negative yoke current portion and by transistor 38 alone during the positive current portion. During the positive current interval transistor 38 is again conducting in its forward direction and therefore able to conduct the full deflection winding current.

It is noted that there is a direct current feedback path from the junction of deflection winding 43 and feedback resistor 44 to the emitter of error amplifying transistor 12. The ratio of resistor 17 to resistor 47 determines the gain of the transistor 12 stage for the error signals. Transistor 12 compares the desired scanning current waveform coupled to its base electrode with a sample of the actual deflection winding current applied to its emitter electrode. The difference between these two signals is amplified and results in the pulse width modulation drive waveform coupled to the output transistors 38 and 39. The relatively small horizontal perturbations present on the feedback waveform coupled to the emitter of transistor 12 are effectively removed by integration through capacitor 16 in the collector circuit of transistor 12.

It should be noted that since the average current through the deflection yoke is zero during a complete vertical deflection cycle, the average voltage is zero also. During the retrace interval there is a fully positive (+V minus the voltage across capacitor 45) voltage across the yoke, necessary to reverse the current in the yoke. Similarly, since there is a constant negative slope to the deflection current during scan, there must be an average negative voltage across the yoke during the scan interval. Since the time integral of yoke voltage during retrace must equal the negative of the time integral of the yoke voltage during scan, the average duty cycle of the yoke voltage during scan must be selected to achieve this condition. This is accomplished by varying the ratio of resistor 13 to resistor 14, which, as stated above, sets the direct current voltage level across capacitor 45. This direct current voltage, along with the +V voltage level determines the average duty cycle during scan. The extremes of variation of the duty cycle are determined by the peak yoke currents, yoke impedance, the voltage across capacitor 45, and the magnitude of the +V supply.

From the above explanation it has been shown that the current amplifying transistors 38 and 39 were either cut off or in saturation either in a forward or reverse current conducting condition. The diodes 41 and 42 function to provide a path for the deflection winding current which is in excess of the reverse current capabilities of the transistors 38 and 39. Therefore, since the output amplifying stage including the transistors 38 and 39 and diodes 41 and 42, effectively operated as a switch, the dissipation losses across transistors 38 and 39 are greatly diminished. It has been determined that the dissipation loss in each of transistors 38 and 39 is on the order of 50 milliwatts, whereas the dissipation loss in each of the transistors of a class B push-pull amplifier stage is on the order of 500 milliwatts for the same yoke. The substantially less power dissipation of the transistor 38 and 39 in the described class D deflection amplifiers embodied in the invention make it feasible to use smaller transistors and/or to incorporate the transistors 38 and 39 as part of the integrated circuit thereby substantially reducing the cost of the vertical deflection circuit in a television receiver.

What is claimed is:
1. A class D amplifier comprising:
first and second serially coupled active current conducting devices;
first and second unidirectional current conducting devices respectively parallelly coupled to said first and second active devices and poled for conducting forward current in a direction opposite to forward current conduction in said first and second active devices;
means coupling the junction of said first and second active devices to the junction of said first and second unidirectional devices for forming an output terminal adapted for supplying current to a load; and
means coupled to control electrodes of said first and second active devices for providing signals for alternately enabling said first and second active devices for conduction such that during a first portion of an amplifying cycle said first active device conducts in the forward direction and said second active device conducts in its reverse direction, and during a second portion of said amplifying cycle said second active device conducts in its forward direction and said first active device conducts in its reverse direction for minimizing crossover distortion in said amplifier.

2. A class D amplifier according to claim 1 wherein said means coupled to said control electrodes includes biasing means for maintaining forward conduction of said respective first and second unidirectional devices when the reverse current through said respective first and second active devices exceeds a predetermined amount.

3. A class D deflection amplifier comprising:
first and second serially coupled active current conducting devices;
first and second unidirectional current conducting devices respectively parallelly coupled to said first and second active devices and poled for conducting forward current in a direction opposite to forward current conduction in said first and second active devices;
means coupling the junction of said first and second active devices to the junction of said first and second unidirectional devices for forming an output terminal adapted for supplying scanning current to a deflection winding; and means coupled to control electrodes of said first and second active devices for providing a pulse width modulated signal having a first frequency, said modulation being representative of the amplitude of a second frequency signal for alternately enabling said first and second active devices for conduction such that during a first portion of said second frequency signal said first active device conducts in the forward direction and said second active device and said second unidirectional device conduct in their reverse and forward directions, respectively, and during a second portion of said second frequency signal said second active device conducts in its forward direction and said first active device and said first unidirectional device conduct in their reverse and forward directions, respectively.

4. A class D deflection amplifier according to claim 3 wherein said first and second active devices comprise first and second transistors having their main conduction paths coupled for forming a push-pull amplifier configuration, said first frequency signal is a signal at a multiple including one of the horizontal deflection rate and said second frequency signal is at the vertical deflection rate.

5. A class D deflection amplifier according to claim 4 wherein said vertical deflection rate signal comprises a sawtooth waveform for effecting modulation of said horizontal rate signals coupled to said push-pull amplifier such that the average current obtained from said output terminal comprises a sawtooth current waveform at the vertical deflection rate for application to said deflection winding.

6. A class D deflection amplifier comprising:
first and second active current conducting devices serially coupled between first and second terminals of a source of operating current;
first and second unidirectional current conducting devices each coupled to a junction of said first and second active current conducting devices and each coupled to a respective one of said first and second terminals of said source of current, said first and second unidirectional devices respectively being poled for conducting current in their forward direction in directions opposite to the forward current paths of said first and second active devices, respectively, said junction forming an output terminal adapted to supply scanning current to a deflection winding;
a source of first signals having a first frequency;
a source of second signals having a second frequency;
modulating means coupled to said source of first and second signals for pulse width modulating said first signals in accordance with the amplitude of said second signals, said modulating means being coupled to control electrodes of said first and second active devices for enabling conduction thereof by said pulse width modulated first signals, such that when average current is flowing in a first direction in said deflection winding said first active device conducts in its forward direction and said second active device and said second unidirectional device conduct in their reverse and forward directions, respectively, and when average current is flowing in the opposite direction in said deflection winding said second active device conducts in its forward direction and said first active device and said first unidirectional device conduct in their reverse and forward directions, respectively.

7. A class D deflection amplifier according to claim 6 wherein said first signals comprise signals at a multiple including one of the horizontal deflection rate and said second signals comprise sawtooth signals at the vertical deflection rate.

* * * * *